United States Patent

[11] 3,582,835

[72] Inventor Eugene C. Walding
Arlington Heights

[21] Appl. No. 845,232
[22] Filed July 28, 1969
[45] Patented June 1, 1971
[73] Assignee Oak Electro/Netic Corp.
Crystal Lake,

[54] FILTER SWITCHING CIRCUIT
7 Claims, 5 Drawing Figs.

[52] U.S. Cl. .......... 333/70, 333/7
[51] Int. Cl. .......... H03h 7/10
[50] Field of Search .......... 333/7, 70, 28, 74

[56] References Cited

UNITED STATES PATENTS

| | | | |
|---|---|---|---|
| 1,735,742 | 11/1929 | Fetter | 333/70 |
| 2,525,566 | 10/1950 | Terlecki et al. | 33/74X |

*Primary Examiner*—Herman Karl Saalbach
*Assistant Examiner*—Marvin Nussbaum
*Attorney*—Parker, Carter & Markey

ABSTRACT: A filter switching circuit including a plurality of inductive and capacitive circuit elements. In one position of a two-position switch all of the circuit elements are connected to form a band-pass filter between an input and an output. In the other position of the switch the same circuit elements are connected to form a band-stop or band rejection filter.

INVENTOR.
Eugene C. Walding
BY Parker, Carter & Markey
Attorneys.

FILTER SWITCHING CIRCUIT

SUMMARY OF THE INVENTION

This invention relates to a filter switching circuit and in particular to a two-position switching circuit providing a band-pass filter in one position and a band-stop filter in the other position.

Another purpose is a filter circuit of the type described in which all of the circuit elements are utilized in both filters.

Another purpose is a filter switching circuit of the type described in which the band-pass filter frequency range is substantially the same as the band-stop filter frequency range.

Another purpose is a reliably operable, compact, efficient low-cost filter switching circuit of the type described.

Other purposes will appear in the ensuing specification, drawings and claims.

BRIEF DESCRIPTION OF THE DRAWINGS

The invention is illustrated diagrammatically in the following drawings wherein.

DESCRIPTION OF THE PREFERRED EMBODIMENT

Figures 1, 2, 3, 4, 5:
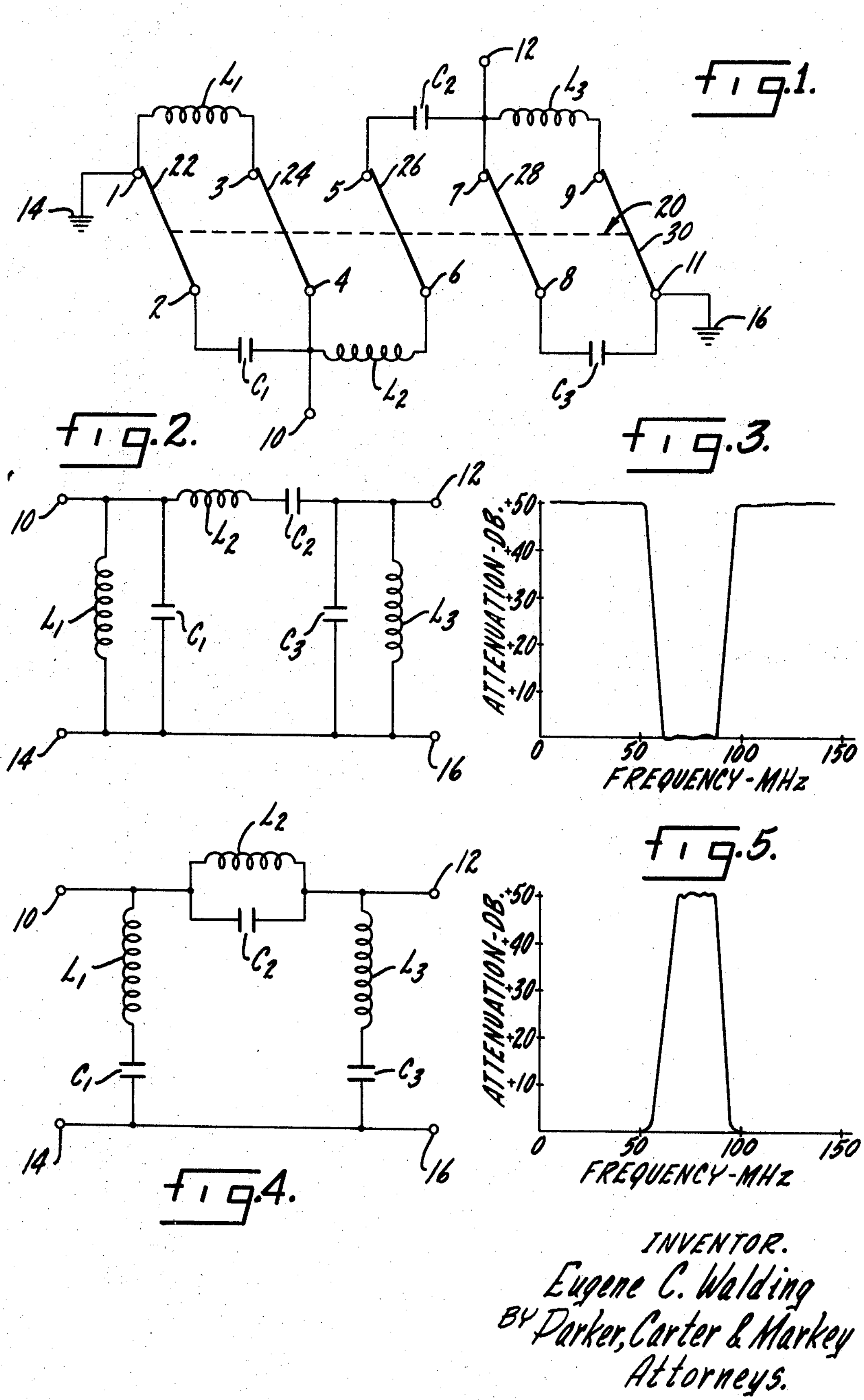
FIG. 1 is a circuit diagram of the filter switching circuit disclosed herein.
FIG. 2 is a circuit diagram illustrating the band-pass filter provided when the switch is in one position.
FIG. 3 is a graph of attenuation vs. frequency for the band-pass filter of FIG. 2.
FIG. 4 is a circuit diagram illustrating the band-stop filter provided when the switch is in a second position.
FIG. 5 is a graph of attenuation vs. frequency for the band-stop filter of FIG. 4.

In FIG. 1, an input terminal is indicated at 10 and an output terminal is indicated at 12. One side of the input is grounded, as at 14, and one side of the output is grounded, as at 16. A switch, indicated diagrammatically at 20, may have five switch arms designated as 22, 24, 26, 28 and 30. The switch 20 is in the band-pass position in FIG. 1 and thus arm 22 connects terminals 1 and 2 of the switch, arm 24 connects terminals 3 and 4, arm 26 connects terminals 5 and 6, arm 28 connects terminals 7 and 8 and arm 30 connects terminals 9 and 11. In the other position of the two-position switch 20, arm 22 will connect terminals 2 and 3, arm 24 will connect terminals 4 and 5, arm 26 will connect terminals 6 and 7, and arm 28 will connect terminals 8 and 9.

The filter circuit shown is made up of a plurality of inductive and capacitive circuit elements. A first inductor $L_1$ is connected between terminals 1 and 3. Capacitor $C_1$ is connected between terminals 2 and 4 and inductance $L_2$ is connected between terminals 4 and 6. Capacitance $C_2$ is connected between terminals 5 and 7 and inductance $L_3$ is connected between terminals 7 and 9. The circuit is completed by capacitance $C_3$ which is connected between terminals 8 and 11.

When the switch 20 is in the band-pass position illustrated in FIG. 1, the effective circuit will be as shown in FIG. 2. $L_1$ and $C_1$ are in parallel at the input and $C_3$ and $L_3$ are in parallel at the output. The series combination of $L_2$ and $C_2$ is connected between the two parallel inductive and capacitance combinations.

When switch 20 has been moved to the second position, or the band-stop position, shown in FIG. 4, the series combination of $L_1$ and $C_1$ is connected across the input and the series combination of $L_3$ and $C_3$ is connected across the output. The parallel combination of $L_2$ and $C_2$ is connected between the two series combinations.

The filters illustrated in FIGS. 2 and 4 are both conventional filter circuits conveniently described as constant K filters. The present invention is particularly directed to the switching means for interconnecting the same elements in either a band-pass or band-stop filter and not to the particular type of filter.

The present invention has particular application in the television field and specifically in the field of cable TV. In such use, the filter circuit shown provides a means for reducing interference at the receiver input due to the mixing of the lower frequencies with the harmonically related upper frequencies. For example, in a 26 channel cable TV system using the frequency range of 57—243 MHz., the lower frequencies are harmonically related to the upper frequencies. The second, third and fourth harmonics of 57 MHz. provide signals of 114, 181 and 228 MHz., which are within the overall frequency range of 57—243 MHz. In addition, a cable TV system utilizing a 330 MHz. IF system may have interference from signals that are 165 MHz. apart. For example, a 57 MHz. signal will provide interference with a 222 MHz. upper frequency signal.

As a specific example, each of the components in the circuit of FIG. 1 may have the following values:

$L_1$=162 mh.
$C_1$=30 pf.
$L_1$=324 mh.
$C_2$=15 pf.
$L_3$=162 mh.
$C_3$=30 pf.

Using the specific application of a cable TV system and a center frequency of 74 MHz., the components above provide a band-pass filter whose attenuation vs. frequency characteristics are shown in the graph of FIG. 3. There is a 50 db. difference in attenuation in the band-pass range of 50—100 MHz. In the graph of FIG. 5, illustrating the filter of FIG. 4 with the above components there is again a 50 db. attenuation difference in the 50—100 MHz. frequency range, however, in this case the frequency band is effectively rejected or blocked out, whereas in the FIG. 3 graph the frequency band in question is passed. This particular frequency relationship sill eliminate the interference described above so that there will be no mixing at the receiver input of the lower frequencies with the harmonically related upper frequencies.

The invention should not be limited to the specific inductive and capacitive components shown, nor to the particular filter arrangements which have been described herein. Various types of filters may be designed as what is important is to provide a filter switching circuit in which one position of a switch provides one type of filter, and in which the second position of the same switch, using the same circuit elements, provides a second filter.

I claim:

1. In a filter circuit, an input and an output, a plurality of inductive and capacitive circuit elements connected between said input and output,
   two-position switch means interconnected with said inductive and capacitive circuit elements,
   one position of said switch means interconnecting all of said circuit elements to form a band-pass filter between said input and said output, the other position of said switch means interconnecting all of said circuit elements to form a band stop filter between said input and said output.

2. The circuit of claim 1 further characterized in that said band-pass frequency range is substantially identical with said band-stop frequency range.

3. The circuit of claim 1 further characterized in that in said one position of said switch means, said band-pass filter includes the parallel combination of an inductance and a capacitance at the input and the parallel combination of an inductance and a capacitance at the output.

4. The circuit of claim 3 further characterized by the series combination of an inductance and a capacitance connected between said parallel combinations.

5. The circuit of claim 1 further characterized in that in said other position of said switch means said band-stop filter includes the series combination of an inductance and a capacitance at the input and the series combination of an inductance and a capacitance at the output.

6. The circuit of claim 5 further characterized by and including the parallel combination of an inductance and a capacitance connected between said series combinations.

7. In a filter circuit, an input and an output, a plurality of inductive and capacitive circuit elements connected between said input and output into an input section, an output section and an intermediate section, said intermediate section including an inductance and a capacitance, two-position switch means interconnected with said inductive and capacitive circuit elements, one position of said switch means interconnecting all of said circuit elements to form a first filter between said input and output, with said intermediate section inductance and capacitance being series connected, the other position of said switch means connecting all of said circuit elements to form a second, different filter between said input and output, with said intermediate section inductance and capacitance being connected in parallel.